United States Patent
Wang et al.

(10) Patent No.: US 11,443,915 B2
(45) Date of Patent: Sep. 13, 2022

(54) DETECTION OF BURIED FEATURES BY BACKSCATTERED PARTICLES

(71) Applicant: ASML Netherlands B.V., Veldhoven (NL)

(72) Inventors: Joe Wang, Campbell, CA (US); Chia Wen Lin, Saratoga, CA (US); Zhongwei Chen, San Jose, CA (US); Chang-Chun Yeh, Miaoli County (TW)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/649,975

(22) PCT Filed: Sep. 21, 2018

(86) PCT No.: PCT/EP2018/075610
§ 371 (c)(1),
(2) Date: Mar. 23, 2020

(87) PCT Pub. No.: WO2019/063432
PCT Pub. Date: Apr. 4, 2019

(65) Prior Publication Data
US 2020/0243299 A1  Jul. 30, 2020

Related U.S. Application Data

(60) Provisional application No. 62/563,601, filed on Sep. 26, 2017.

(51) Int. Cl.
*H01J 37/28* (2006.01)
*H01J 37/244* (2006.01)
*H01J 37/22* (2006.01)

(52) U.S. Cl.
CPC .......... *H01J 37/244* (2013.01); *H01J 37/222* (2013.01); *H01J 37/28* (2013.01);
(Continued)

(58) Field of Classification Search
CPC .............. H01J 37/28; H01J 2237/2805; H01J 2237/2446
See application file for complete search history.

(56) References Cited

U.S. PATENT DOCUMENTS

| | | |
|---|---|---|
| 4,897,545 A | 1/1990 | Danilatos |
| 5,412,210 A | 5/1995 | Todokoro et al. |
| 9,116,109 B2 | 8/2015 | Xiao et al. |

(Continued)

FOREIGN PATENT DOCUMENTS

| | | |
|---|---|---|
| CN | 1042029 A | 5/1990 |
| EP | 0721201 A1 | 7/1996 |

(Continued)

OTHER PUBLICATIONS

International Search Report issued in related PCT International Application No. PCT/EP2018/075610, dated Mar. 11, 2019 (4 pgs.).

(Continued)

*Primary Examiner* — Eliza W Osenbaugh-Stewart
(74) *Attorney, Agent, or Firm* — Finnegan, Henderson, Farabow, Garrett & Dunner, LLP (57) ABSTRACT

Disclosed herein an apparatus and a method for detecting buried features using backscattered particles. In an example, the apparatus comprises a source of charged particles; a stage; optics configured to direct a beam of the charged particles to a sample supported on the stage; a signal detector configured to detect backscattered particles of the charged particles in the beam from the sample; wherein the signal detector has angular resolution. In an example, the methods comprises obtaining an image of backscattered particles from a region of a sample; determining existence or location of a buried feature based on the image.

17 Claims, 11 Drawing Sheets

(52) U.S. Cl.
CPC . *H01J 2237/221* (2013.01); *H01J 2237/2446* (2013.01); *H01J 2237/2448* (2013.01); *H01J 2237/24475* (2013.01); *H01J 2237/24528* (2013.01); *H01J 2237/2805* (2013.01); *H01J 2237/31762* (2013.01)

(56) References Cited

U.S. PATENT DOCUMENTS

| | | | |
|---|---|---|---|
| 2006/0060782 A1* | 3/2006 | Khursheed | G01N 23/225 250/310 |
| 2009/0242792 A1* | 10/2009 | Hosoya | H01J 37/244 250/397 |
| 2013/0256528 A1* | 10/2013 | Xiao | G01N 23/2251 250/307 |
| 2016/0299103 A1 | 10/2016 | Saleh et al. | |
| 2016/0379798 A1 | 12/2016 | Shishido et al. | |

FOREIGN PATENT DOCUMENTS

| | | |
|---|---|---|
| EP | 2560185 B1 | 12/2014 |
| JP | H 04504325 A | 7/1992 |
| JP | H 0765775 A | 3/1995 |
| JP | H 08273569 A | 10/1996 |
| JP | 2008-232765 A | 10/2008 |
| JP | 2013-174587 A | 9/2013 |
| JP | 2015-106530 A | 6/2015 |
| KR | 10-2015-0014994 | 2/2015 |
| KR | 10-1762219 | 7/2017 |
| TW | 2016-18151 A | 5/2016 |
| TW | 2016-21963 A | 6/2016 |

OTHER PUBLICATIONS

Notice for Reasons for Rejection issued by the Japanese Patent Office in related JP Application No. 2002-514958, dated Apr. 28, 2021 (16 pgs.).

Notification of Reason(s) for Refusal issued in related Korean Patent Application No. 10-2020-7008505; dated Aug. 24, 2021 (12 pgs.).

First Office Action from the Patent Office of the People's Republic of China issued in related Chinese Patent Application No. 201880062475X; dated Jun. 10, 2022 (13 pgs.).

* cited by examiner

DETECTION OF BURIED FEATURES BY BACKSCATTERED PARTICLES

CROSS-REFERENCE TO RELATED APPLICATIONS

This application is a national stage filing under 35 U.S.C. § 371 of International Application No. PCT/EP2018/075610, filed on Sep. 21, 2018, and published as WO 2019/063432 A1, which claims priority of U.S. Provisional Application No. 62/563,601, which was filed on Sep. 26, 2017, all of which are incorporated herein by reference in their entireties.

TECHNICAL FIELD

This disclosure relates to methods and apparatuses for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is an apparatus comprising: a source of charged particles; a stage; optics configured to direct a beam of the charged particles to a sample supported on the stage; a signal detector configured to detect backscattered particles of the charged particles in the beam from the sample; wherein the signal detector has angular resolution.

According to an embodiment, the signal detector is positioned around a primary beam axis of the apparatus.

According to an embodiment, the signal detector is configured to detect backscattered electrons.

According to an embodiment, the signal detector comprises a first detector component and a second detector component, wherein the first detector component and the second detector component are configured to detect backscattered particles with different angles from an axis of the beam.

According to an embodiment, the first detector component and the second detector component are annular in shape and positioned coaxially.

According to an embodiment, the signal detector has an aperture that allows the beam to reach the sample.

Disclosed herein is a method comprising: obtaining an image of backscattered particles from a beam of charged particles from a region of a sample; determining existence or location of a buried feature based on the image.

According to an embodiment, the method further comprises identifying the region from a design of structure on the sample.

According to an embodiment, the buried feature is a buried void.

According to an embodiment, the buried void is in a via connecting two electric components that are at different depths under a surface of the sample.

According to an embodiment, determining the existence or location of the buried feature comprises comparing the image with a reference image.

According to an embodiment, the reference image is obtained from the region, from a same die that includes the region, from another region of the sample, or from a different sample.

According to an embodiment, the image and the reference image are formed with backscattered particles of different angles from the beam.

According to an embodiment, the reference image is simulated from a design of structures in the region or process conditions under which the structures are formed.

According to an embodiment, comparing the image with the reference image comprises aligning the image and the reference image and subtracting corresponding pixels.

According to an embodiment, determining the existence or location of the buried feature comprises inputting the image into a machine learning model that outputs the existence or location of the buried feature.

According to an embodiment, determining the existence or location of the buried feature comprises processing the image and is based on a result of the processing.

According to an embodiment, processing the image comprises detecting edges in the image.

According to an embodiment, processing the image comprises obtaining a cross-section of the image and obtaining a derivative of the cross-section.

Disclosed herein is a computer program product comprising a non-transitory computer readable medium having instructions recorded thereon, the instructions when executed by a computer implementing any of the above methods.

DETAILED DESCRIPTION

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

Figure 1:
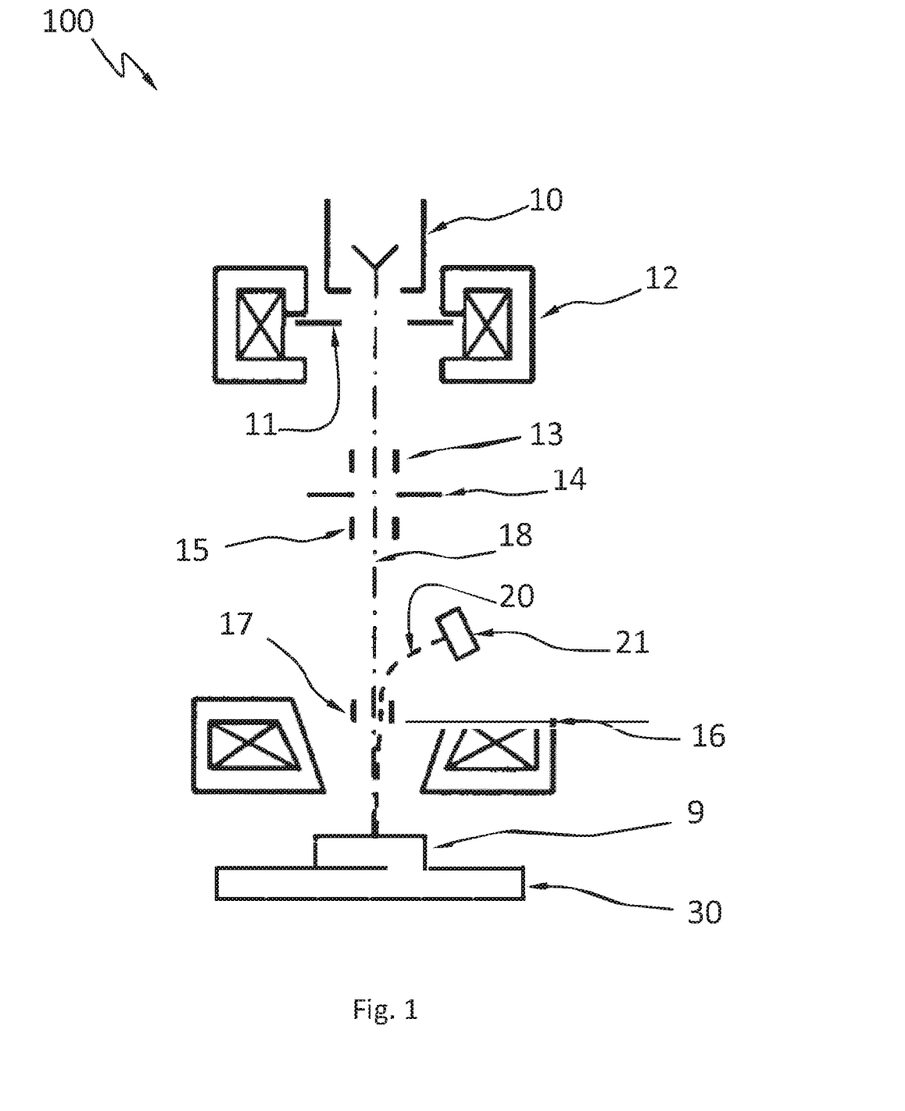
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample, such as an ExB charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the ExB charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used.

Figure 2A:
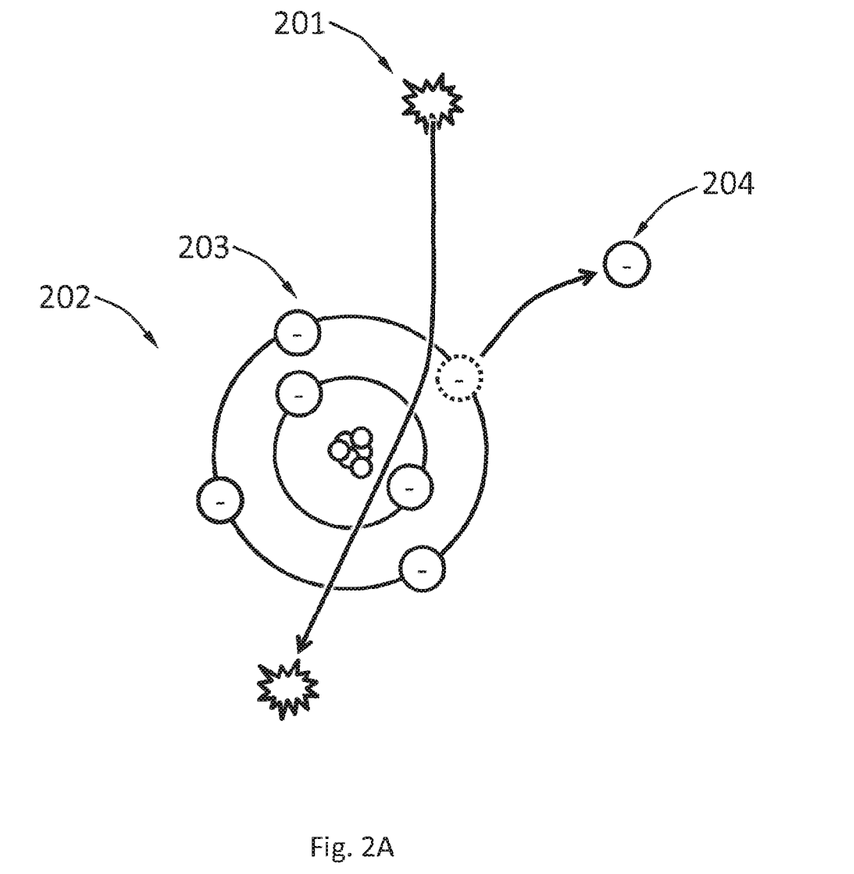
FIG. 2A schematically shows the production of secondary electrons.

The signal 20 may be secondary particles (e.g., secondary electrons ("SE"), Auger electrons, X-ray, or cathodoluminescence), backscattered particles (e.g., backscattered electrons ("BSE")). Secondary particles are particles emitted from the sample 9 due to secondary emission. Secondary particles are called "secondary" because they are generated by bombardment of other particles ("the primary particles") such as the charged particles in the beam of charged particles here. The primary particles are not limited to charged particles but can also be photons or neutrons. In an example, when the beam of charge particles hit the sample 9, if the charge particles have energies exceeding the ionization potential of the electrons in the sample 9, some of the electrons in the sample 9 may be ionized, by receiving energy from the charged particles. The production of secondary particles is an inelastic event. FIG. 2A schematically shows the production of secondary electrons. A particle 201 is directed to an atom 202. If the particle 201 has an energy exceeding the ionization potential of at least some of the electrons 203 of the atom 202, the particle 201 may lose some of its energy to one of the electrons 203 and eject it from the atom 202. The ejected electron 204 is a secondary electron.

Figure 2B:
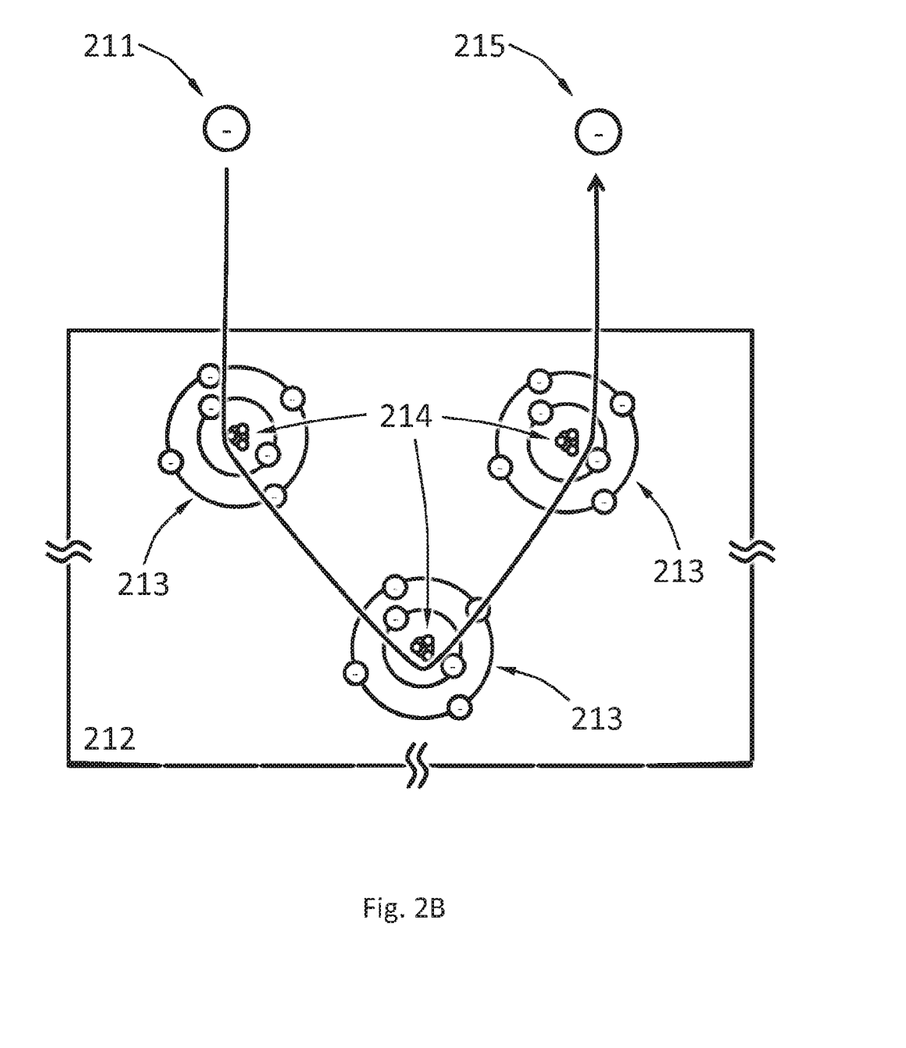
FIG. 2B schematically shows the production of backscattered electrons as an example of backscattered particles.

Backscattered particles are incident particles that are bounced back by the sample 9. The charged particles in the beam of charged particles may be reflected or "backscattered" out of the sample 9 by elastic scattering interactions with the nuclei of the atoms in the sample 9. Heavier atoms in the sample 9 backscatter more strongly. Therefore, backscattered particles may carry information of the composition of the sample 9. The production of backscattered particles is a largely elastic event. The backscattered particles have similar energy to the charged particles in the beam. FIG. 2B schematically shows the production of backscattered electrons as an example of backscattered particles. An electron 211 (e.g., an electron from the beam) is directed to a sample 212 including atom 213. The interaction between the electron 211 and the nuclei 214 of the atoms 213 may cause the electron 211 to be backscattered out of the sample 212 as a backscattered electron 215.

When the beam of charged particles hits the sample 212, the charged particles interact with atoms in a three-dimensional volume of the sample 212, which is called the interaction volume. The interaction volume can have linear dimensions orders of magnitude greater than the sample surface under the footprint of the beam. The size and shape of the interaction volume may be affected by a number of factors, such as the landing energy of the charged particles, the atomic number of the atoms of the sample 212, the density of the sample 212, the incident angle of the beam relative to the local area of incidence, etc.

Not all signals generated in the interaction volume can escape the sample 212 to allow detection. If the signal is generated from a position too deep under the surface of the sample, it cannot escape. The maximum depth at which a signal is generated and can still escape is called the escape depth. For example, the escape depth of secondary electrons is approximately 5-50 nm; the escape depth of backscattered electrons can be 500-5000 nm; the escape depth of X-ray is even greater.

Because the escape depth may be relatively large compared to the dimensions of the structures in the sample, charged particle beam inspection may be used to measure features buried under the surface of the sample. Backscattered particles tend to have a larger escape depth than secondary particles. Therefore, backscattered particles tend to be more suitable than secondary particles to measure buried features.

One particular kind of buried features is buried voids. Buried voids may be detrimental to the integrity of ICs. For example, buried voids in vias may cause disconnection between circuits at different depths and thus cause failure of an entire IC chip.

Figure 3A:
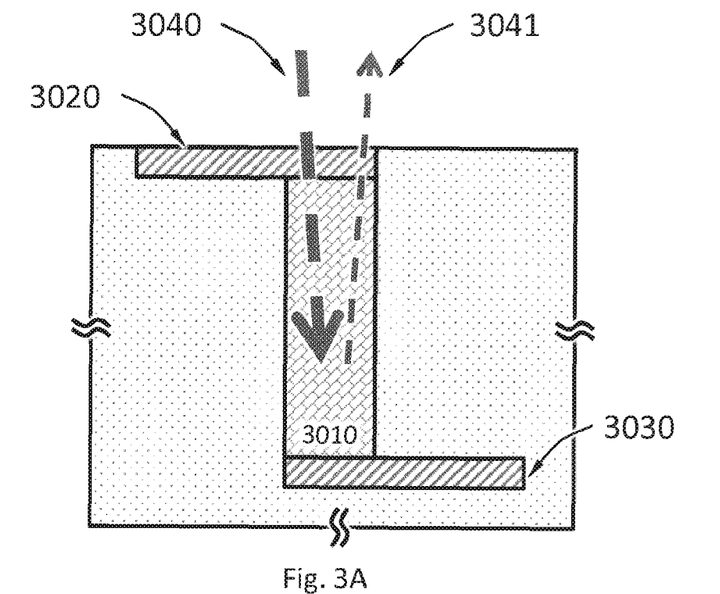
FIG. 3A schematically shows a cross-sectional view of a via connecting two electric components that are at different depths under the surface of a sample.
Figure 3B:
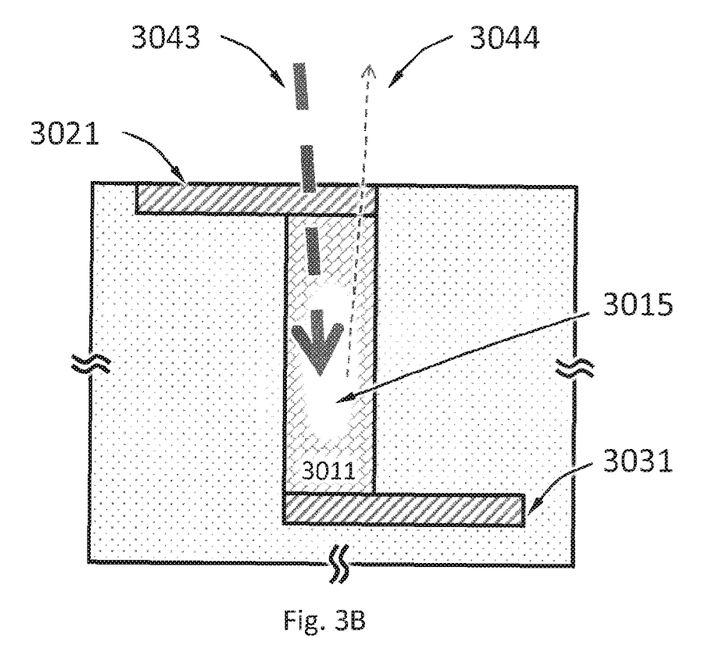
FIG. 3B schematically shows a cross-sectional view of another via connecting two electric components that are at different depths under the surface of a sample.

FIG. 3A schematically shows a cross-sectional view of a via 3010 connecting two electric components 3020 and 3030 that are at different depths under the surface of a sample. The via 3010 does not have a void in it. A beam of charged particles 3040 impinging on the vias 3010 produces backscattered particles 3041 that escape from the sample. FIG. 3B schematically shows a cross-sectional view of a via 3011 connecting two electric components 3021 and 3031 that are at different depths under the surface of a sample. The via 3011 is identical to the vias 3010 except that the vias 3011 has a void 3015 therein. The void 3015 may be buried under the surface of the sample, for example, beyond the escape depth of second particles but within the escape depth of backscattered particles. A beam of charged particles 3043 impinging on the vias 3011 produces backscattered particles 3044 that escape from the sample. Because the vias 3011 has the void 3015 therein, the via 3011 has fewer atoms that may backscatter incident particles than the via 3010. Therefore, even if the beam of charged particles 3040 and the beam of charged particles 3043 have the same intensity, the backscattered particles 3041 have greater intensity than the backscattered particles 3044.

Figure 4:
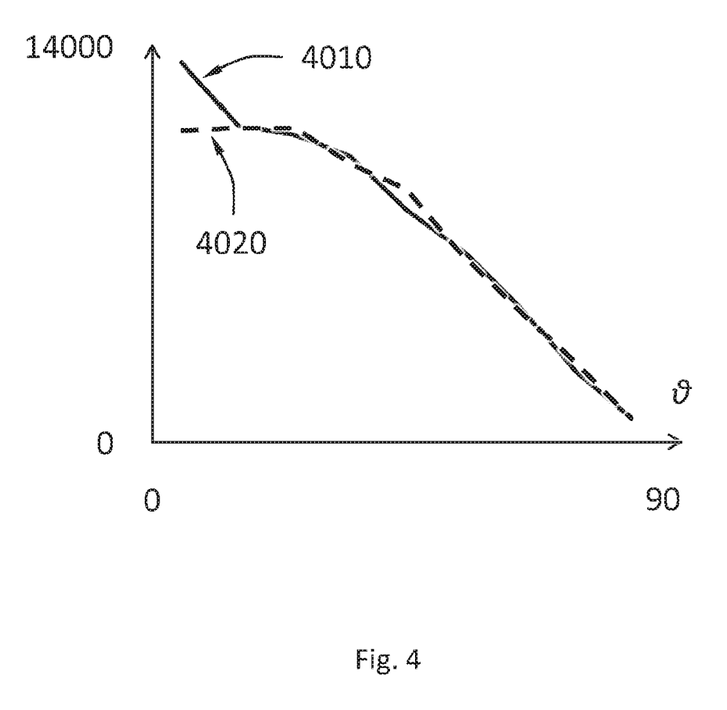
FIG. 4 schematically shows the radial density per solid angle (in an arbitrary unit) I of backscattered particles from a via with a buried void as a function of angle θ from the axis of the incident beam of charged particles (in the unit of degrees) and I of backscattered particles from a via without a buried void as a function of θ.

The existence of a buried void may affect not only the intensity of the backscattered particles, but also the angular dependence the backscattered particles. For example, the backscattered particles 3041 and backscattered particles 3044 may have different angular dependence. FIG. 4 schematically shows the radial density per solid angle (in an arbitrary unit) I of backscattered particles 4020 from a via with a buried void as a function of angle θ from the axis of the incident beam of charged particles (in the unit of degrees) and I of backscattered particles 4010 from a via without a buried void as a function of θ. In this example, the difference in the angular dependence is significant at low angles.

Figure 5A:
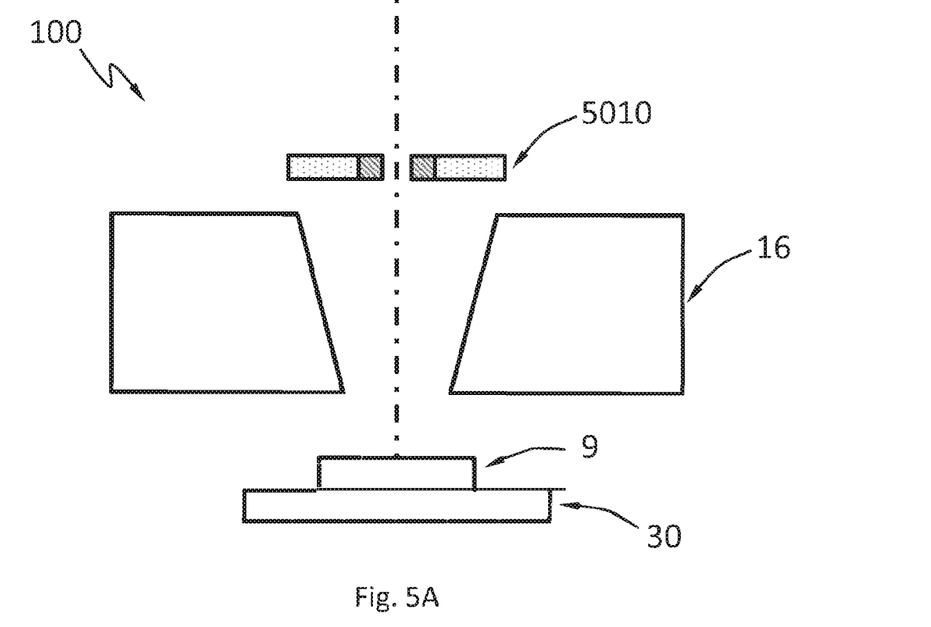
FIG. 5A schematically shows a portion of the apparatus of FIG. 1, according to an embodiment.
Figure 5B:
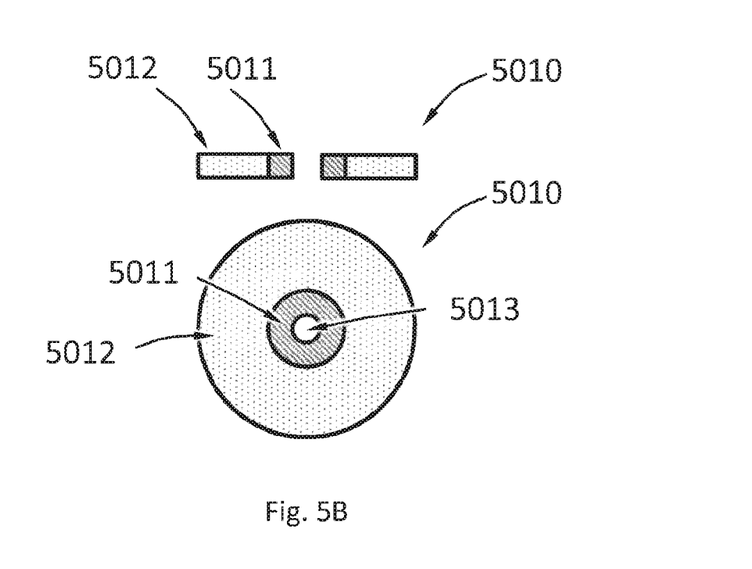
FIG. 5B schematically shows the cross-sectional view and top view of the signal detector of FIG. 5A.

FIG. 5A schematically shows a portion of the apparatus 100, according to an embodiment. The apparatus 100 has a signal detector 5010 configured to detect backscattered particles from the sample 9 and the signal detector 5010 has angular resolution. The signal detector 5010 may be positioned around the primary beam axis of the apparatus 100. FIG. 5B schematically shows the cross-sectional view and top view of the signal detector 5010. The signal detector 5010 may comprise a first detector component 5011 and a second detector component 5012. The first detector component 5011 and the second detector component 5012 are configured to detect backscattered particles with different θ. In an example, the first detector component 5011 and the second detector component 5012 are annular in shape and positioned coaxially. The signal detector 5010 may have an aperture 5013 to allow the beam to reach the sample 9.

Figure 6:
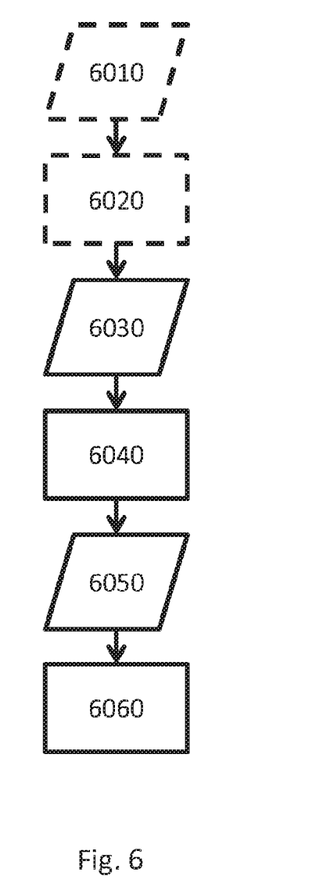
FIG. 6 schematically shows a flowchart for a method for charged particle beam inspection, according to an embodiment.

An image of backscattered particles obtained from a sample may be used to detect buried features. FIG. 6 schematically shows a flowchart for a method for charged particle beam inspection, according to an embodiment. In step 6040, an image 6050 of backscattered particles is obtained from a region 6030 of a sample. The method may include an optional step 6020, in which the region 6030 is identified from a design 6010 (e.g., as represented by a GDS file) of structures on the sample. For example, the locations of vias (e.g., the via 3010 and 3011) on a sample may be determined based on the design 6010 and a region encompassing such a via may be identified as the region 6030. In step 6060, the existence or location of a buried feature is determined based on the image 6050.

Figure 7:
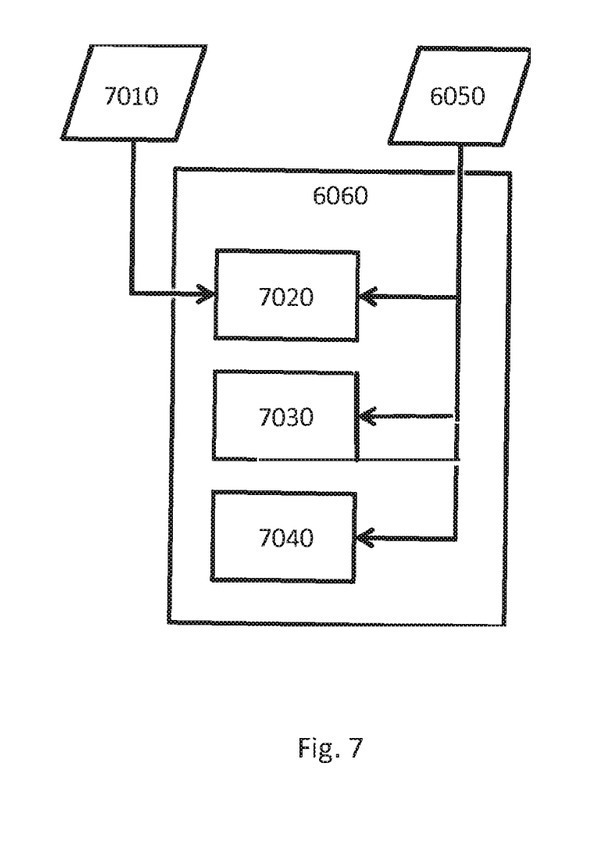
FIG. 7 schematically shows a flowchart of several possible ways for determining the existence or location of a buried feature, according to an embodiment.

The determination of the existence or location of a buried feature in step 6060 may be achieved in a variety of ways. FIG. 7 schematically shows a flowchart of several possible ways for this determination, according to an embodiment. In an example, the image 6050 is compared in step 7020 with a reference image 7010. The reference image 7010 may be obtained from the same region 6030, from the same die that includes the region 6030, from another region of the same sample, even from a different sample. The reference image 7010 may also be an image simulated from the design of the structures in the region 6030 or process conditions under which the structures are formed. The image 6050 and the reference image 7010 may be formed with backscattered particles of different angles from a beam. The existence or location of a buried feature may be determined based on the comparison. In an example, the image 6050 is input into a machine learning model 7030 that outputs the existence or location of the buried feature. In another example, the image 6050 is processed using a suitable model 7040 and the existence or location of the buried feature may be determined based on the result of the processing.

Figure 8:
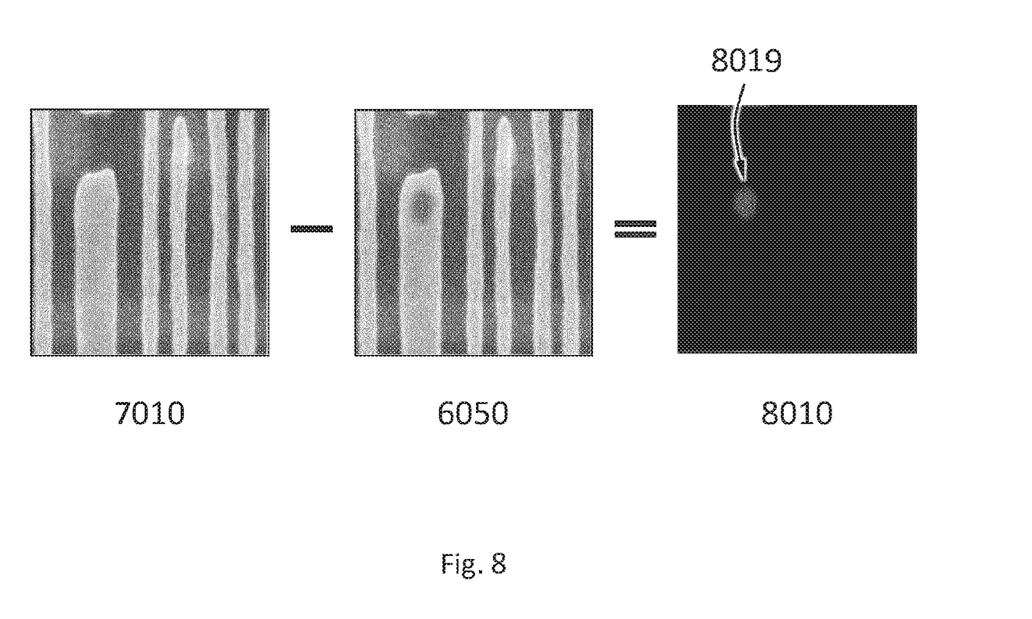
FIG. 8 shows an example of the comparison in a step in FIG. 7.

FIG. 8 shows an example of the comparison in step 7020. The difference 8010 between the reference image 7010 and the image 6050 may be obtained, for example, by aligning the reference image 7010 and the image 6050 and subtracting each corresponding pixel. In this example, a buried feature 8019 may be clearly revealed in the difference 8010.

Figure 9:
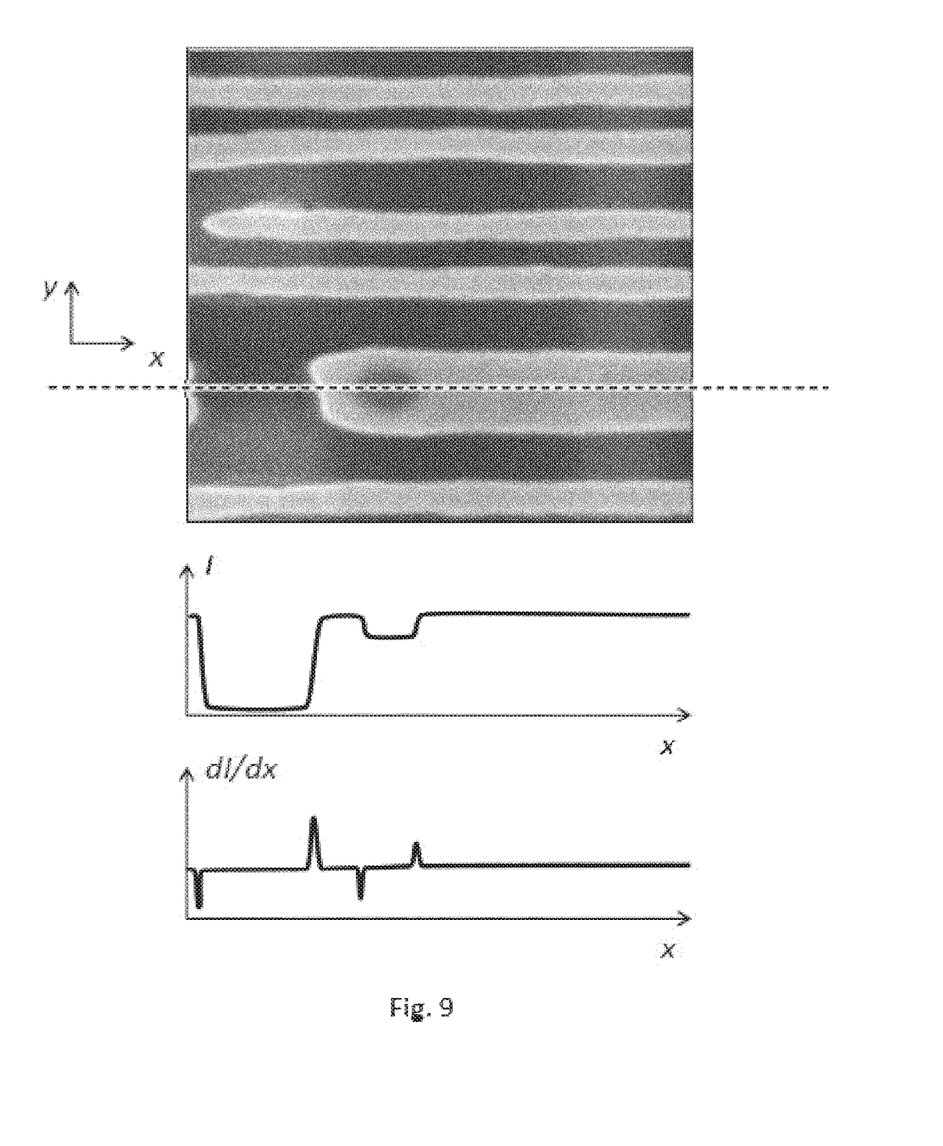
FIG. 9 and FIG. 10 each show an example of processing the image of backscattered particles using a model.

FIG. 9 shows an example of processing the image 6050 using a model 7040. In this example, a cross-section of the image 6050 (as represented by a curve of intensity of signal I as a function of location x) is obtained. The derivative of the intensity I with respect to location x (dI/dx) as a function of location x is obtained. The buried feature may appear as a pair of peak and valley in the derivative.

Figure 10:
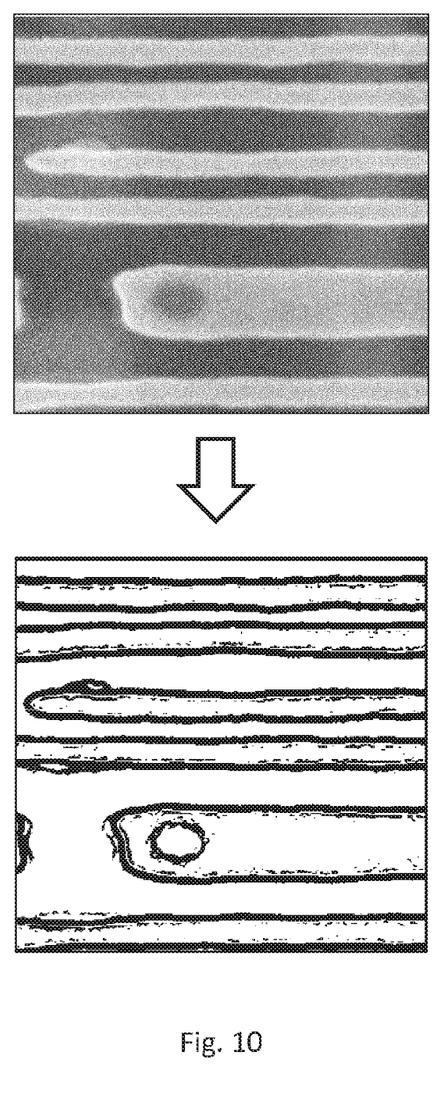

FIG. 10 shows an example of processing the image 6050 using a model 7040. In this example, the image 6050 is subjected to edge detection. The buried feature may appear as a ring.

The embodiments may further be described using the following clauses:

1. An apparatus comprising:
   a source of charged particles;
   a stage;
   optics configured to direct a beam of the charged particles to a sample supported on the stage;
   a signal detector configured to detect backscattered particles of the charged particles in the beam from the sample;
   wherein the signal detector has angular resolution.
2. The apparatus of clause 1, wherein the signal detector is positioned around a primary beam axis of the apparatus.
3. The apparatus of clause 1, wherein the signal detector is configured to detect backscattered electrons.

4. The apparatus of clause 1, wherein the signal detector comprises a first detector component and a second detector component, wherein the first detector component and the second detector component are configured to detect backscattered particles with different angles from an axis of the beam.

5. The apparatus of clause 4, wherein the first detector component and the second detector component are annular in shape and positioned coaxially.

6. The apparatus of clause 1, wherein the signal detector has an aperture that allows the beam to reach the sample.

7. A method comprising:
obtaining an image of backscattered particles from a beam of charged particles from a region of a sample;
determining existence or location of a buried feature based on the image.

8. The method of clause 7, further comprising identifying the region from a design of structure on the sample.

9. The method of clause 7, wherein the buried feature is a buried void.

10. The method of clause 9, wherein the buried void is in a via connecting two electric components that are at different depths under a surface of the sample.

11. The method of clause 7, wherein determining the existence or location of the buried feature comprises comparing the image with a reference image.

12. The method of clause 11, wherein the reference image is obtained from the region, from a same die that includes the region, from another region of the sample, or from a different sample.

13. The method of clause 11, wherein the image and the reference image are formed with backscattered particles of different angles from the beam.

14. The method of clause 11, wherein the reference image is simulated from a design of structures in the region or process conditions under which the structures are formed.

15. The method of clause 11, wherein comparing the image with the reference image comprises aligning the image and the reference image and subtracting corresponding pixels.

16. The method of clause 7, wherein determining the existence or location of the buried feature comprises inputting the image into a machine learning model that outputs the existence or location of the buried feature.

17. The method of clause 7, wherein determining the existence or location of the buried feature comprises processing the image and is based on a result of the processing.

18. The method of clause 17, wherein processing the image comprises detecting edges in the image.

19. The method of clause 17, wherein processing the image comprises obtaining a cross-section of the image and obtaining a derivative of the cross-section.

20. A computer program product comprising a non-transitory computer readable medium having instructions recorded thereon, the instructions when executed by a computer implementing the method of any of clauses 7 to 19.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:

1. An apparatus comprising:
a source of charged particles;
a stage;
optics configured to direct a beam of the charged particles to a sample supported on the stage;
a signal detector configured to detect backscattered particles of the charged particles in the beam from the sample, wherein the signal detector comprises a first detector component and a second detector component, wherein the first detector component and the second detector component are configured to detect backscattered particles with different angles relative to an axis of the beam;
wherein the apparatus is configured to detect a feature under a surface of the sample based on a comparison of signals corresponding to backscattered particles detected by the first and second detector components.

2. The apparatus of claim 1, wherein the signal detector is positioned around a primary beam axis of the apparatus.

3. The apparatus of claim 1, wherein the signal detector is configured to detect backscattered electrons.

4. The apparatus of claim 1, wherein the first detector component and the second detector component are annular in shape and positioned coaxially.

5. The apparatus of claim 1, wherein the signal detector has an aperture that allows the beam to reach the sample.

6. A method comprising:
obtaining a first image of backscattered particles from a beam of charged particles from a region of a sample, the first image being formed with backscattered particles having a first angle;
obtaining a second image of backscattered particles from a beam of charged particles from the region of the sample, the second image being formed with backscattered particles having a second angle different from the first angle; and
determining existence or location of a buried feature based on a comparison of the first and second images.

7. The method of claim 6, further comprising identifying the region from a design of structure on the sample.

8. The method of claim 6, wherein the buried feature is a buried void.

9. The method of claim 8, wherein the buried void is in a via connecting two electric components that are at different depths under a surface of the sample.

10. The method of claim 6, wherein the second image is obtained from the region, from a same die that includes the region, from another region of the sample, or from a different sample.

11. The method of claim 6, wherein the second image is formed with backscattered particles of different angles from the beam.

12. The method of claim 6, wherein determining the existence or location of the buried feature comprises inputting the first image into a machine learning model that outputs the existence or location of the buried feature or wherein determining the existence or location of the buried feature comprises processing the first image and is based on a result of the processing.

13. A non-transitory computer readable medium having instructions recorded thereon, the instructions being executable by at least one processor of a system to cause the system to perform a method comprising:

obtaining a first image of backscattered particles from a beam of charged particles from a region of a sample, the first image being formed with backscattered particles having a first angle;

obtaining a second image of backscattered particles from a beam of charged particles from the region of the sample, the second image being formed with backscattered particles having a second angle different from the first angle; and determining existence or location of a buried feature based on a comparison of the first and second images.

14. The non-transitory computer readable medium of claim 13, wherein the buried feature is a buried void under a surface of the sample.

15. The non-transitory computer readable medium of claim 13, wherein the second image is obtained from the region, from a same die that includes the region, from another region of the sample, or from a different sample.

16. The non-transitory computer readable medium of claim 13, wherein the second image is formed with backscattered particles of different angles from the beam.

17. The non-transitory computer readable medium of claim 13, wherein determining the existence or location of the buried feature comprises inputting the first image into a machine learning model that outputs the existence or location of the buried feature or wherein determining the existence or location of the buried feature comprises processing the first image and is based on a result of the processing.

* * * * *